(12) United States Patent
Shiraki et al.

(10) Patent No.: US 7,605,411 B2
(45) Date of Patent: Oct. 20, 2009

(54) CHARGE TRANSFER DEVICE AND IMAGING APPARATUS

(75) Inventors: Hirokazu Shiraki, Miyagi (JP); Makoto Kobayashi, Miyagi (JP); Katsumi Ikeda, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/175,337

(22) Filed: Jul. 17, 2008

(65) Prior Publication Data

US 2009/0020789 A1 Jan. 22, 2009

(51) Int. Cl.
*H01L 27/148* (2006.01)
*H01L 29/747* (2006.01)
*H01L 29/768* (2006.01)
*H01L 29/74* (2006.01)

(52) U.S. Cl. .................. 257/232; 257/215; 257/223; 257/229; 257/234; 257/235; 257/237; 257/240; 257/241; 257/249; 257/E27.082; 257/E27.083; 257/E27.15; 257/E27.151; 257/E27.152; 257/E27.153; 257/E27.154; 257/E27.155; 257/E27.156; 257/E27.157; 257/E27.158; 257/E27.159; 257/E27.16; 257/E27.163; 257/E29.227; 257/E29.228; 257/E29.234; 257/E29.235; 257/E29.236; 257/E29.237; 257/E29.238; 257/E29.239; 257/E29.24

(58) Field of Classification Search ............ 257/215, 257/223, 229, 232, 234–235, 237, 240–241, 257/249, E27.082, E27.083, E27.15, E27.151, 257/E27.152, E27.153, E27.154, E27.155, 257/E27.156, E27.157, E27.158, E27.159, 257/E27.16, E27.163, E29.227, E29.228, 257/E29.234, E29.235, E29.236, E29.237, 257/E29.238, E29.239, E29.24

See application file for complete search history.

(56) References Cited

U.S. PATENT DOCUMENTS

| | | | | |
|---|---|---|---|---|
| 4,811,068 A | * | 3/1989 | Kinoshita | 257/232 |
| 5,309,240 A | * | 5/1994 | Miwada | 348/311 |
| 7,027,093 B2 | * | 4/2006 | Miyahara | 348/313 |
| 7,446,349 B2 | * | 11/2008 | Kobayashi et al. | 257/183.1 |
| 2002/0022293 A1 | * | 2/2002 | Morimoto | 438/52 |
| 2007/0115380 A1 | * | 5/2007 | Shibata et al. | 348/311 |
| 2007/0229691 A1 | * | 10/2007 | Oshima et al. | 348/315 |

FOREIGN PATENT DOCUMENTS

| | | | |
|---|---|---|---|
| JP | 2585604 B2 | 12/1996 |
| JP | 2949861 B2 | 7/1999 |

* cited by examiner

*Primary Examiner*—Ida M Soward
(74) *Attorney, Agent, or Firm*—Birch, Stewart, Kolasch & Birch, LLP

(57) ABSTRACT

An HCCD includes a channel 21 that transfers electric charges in an X direction, a channel 25 that transfers the electric charges in a Z1 direction, a channel 23 that transfers the electric charges in a Z2 direction, and a channel 22 that connects the channels 23, 25 to the channel 21. The following relation is satisfied in impurity concentration of the channels: channel 21 channel 22 channel 23, 25. A fixed DC voltage is applied to branch electrodes 12a, 12b above the channel 22. The channel 22 has protrusion portions 19 that protrude inward from an outer circumference, which connects T1 and T2, and an outer circumference, which connects T3 and T4. The protrusion portions 19 causes charges below the transfer electrode 11b to move near the center of the channel 22 in a Y direction. Thereby, the travel distance of the charges in the channel 22 is reduced.

8 Claims, 6 Drawing Sheets

CHARGE TRANSFER DEVICE AND IMAGING APPARATUS

CROSS-REFERENCE TO RELATED APPLICATIONS

This application is based upon and claims the benefit of priority from the Japanese Patent Application No. 2007-186740 filed on Jul. 18, 2007, the entire contents of which are incorporated herein by reference.

BACKGROUND

1. Technical Field

The invention relates to a charge transfer device that includes a charge transfer path that transfers electric charges, a charge branch path that is connected to the charge transfer path and alternately distributes the electric charges, which are transferred along the charge transfer path, into two directions, and two branch transfer paths that are connected to the charge branch path and are provided corresponding to the two directions.

2. Description of the Related Art

In order to enhance a frame rate in a CCD (Charge Coupled Device) type solid-state imaging device, the following method has been proposed. That is, the method outputs electric charges through multiple lines by branching a horizontal charge transfer path into two lines at an output end thereof and connecting output sections to the two lines, respectively. In such a solid-state imaging device, in order to prevent interference of signal packets, it is necessary to reliably distribute and transfer electric charges in the branch portion that branches the electric charges.

In order to solve this problem, Japanese Patent Nos. 2585604 and 2949861 (corresponding to U.S. Pat. No. 5,309,240) describe technologies that form the branch portion in a triangle shape and reduce the travel time of electric charges in the branch portion by a potential gradient using the short channel effect, thereby suppressing the interference during distribution and transfer of the electric charge.

FIG. 6 is a diagram illustrating the schematic configuration of a horizontal charge transfer device of the related art.

The horizontal charge transfer device shown in FIG. 6 includes a charge transfer path, a charge branch path, and branch transfer paths. The charge transfer path is defined by a charge transfer channel 50 and electrodes 1A, 1B, 2A, and 2B provided above the charge transfer channel 50. The charge branch path is defined by the charge transfer channel 50 and electrodes 3A, 3BP, and 3BR provided above the charge transfer channel 50. The branch transfer paths are defined by the charge transfer channel 50 and electrodes 4A and 4B provided above the charge transfer channel 50.

In the device shown in FIG. 6, in a state where electric charges are accumulated in the charge transfer channel 50 below the electrode 2B by setting a voltage φ2 to a high level and setting voltages φ1, φ1P, and φ1R to a low level, the electric charges below the electrode 2B are transferred to and accumulated in the charge transfer channel 50 below the electrode 3BP by setting the voltage φ2 to a low level and setting the voltages φ1 and φ1P to a high level. Then, the electric charges below the electrode 3BP are transferred to the charge transfer channel 50 below the electrode 4B by setting the voltage φ2 to a high level and setting the voltages φ1 and φ1P to a low level. In this way, the charges are transferred from the charge transfer path to the branch transfer path.

In the device shown in FIG. 6, electric charges which flow linearly from the right side in the figure toward the left side thereof are directed so as to flow toward the upper left side or the lower left side in the charge branch path, and then the electric charges are transferred to the branch transfer path. In FIG. 6, a circled symbol "−" denotes an electron, and an arrow denotes the maximum distance of a travel path of the electron from the charge transfer channel below the electrode 2B to the charge transfer channel below the electrode 3BP. As indicated by the arrow, it can be seen that the electron in the end of the charge transfer path travels linearly for a while due to a fringing electric field generated by the electrode 2B and the electrodes 3A and 3BP, is gradually directed to flow toward the upper left side, and travels to the charge transfer channel below the electrode 3BP. As such, in the charge transfer device that branches the charge transfer path into two lines in the charge branch path, the travel path of electric charges in the charge branch path is elongated due to its structure. As a result, the charge transfer time in the charge branch path becomes longer than the charge transfer time in the charge transfer path and that in the branch transfer paths.

Despite this phenomenon, the device shown in FIG. 6 drives the electrodes in the charge branch path at the same frequency as that for the electrodes in the charge transfer path and the branch transfer paths. Accordingly, the charge transfer time in the charge branch path is limited by the charge transfer time in the charge transfer path and that in the branch transfer paths, which makes it difficult to increase the charge transfer time. As a result charge transfer might not be completed within a predetermined transfer time, and charge transfer efficiency might be deteriorated.

If the charge transfer time in the charge branch path is made longer enough, the above concern can be removed. However, if the travel distance of electric charges in the charge branch path is excessively long, it is necessary to make the charge transfer time be longer correspondingly. Accordingly, it would be difficult to realize it.

SUMMARY OF THE INVENTION

The invention has been made in view of the above circumstances, and provides a charge transfer device that has a transfer path being branched into two lines and can reduce a charge transfer distance during distribution and transfer of electric charges in a charge branch path.

According to an aspect of the invention, a charge transfer device includes a charge transfer path, a charge branch path, first and second branch transfer paths, a plurality of transfer electrodes, a branch electrode, a plurality of first branch transfer electrodes, a plurality of second branch transfer electrodes and a driving unit. The charge transfer path transfers electric charges. The charge branch path is connected to the charge transfer path and distributes the electric charges, which are transferred along the charge transfer path, into two directions. The first and second branch transfer paths are connected to the charge branch path and are provided corresponding to the two directions. The plurality of transfer electrodes are provided above the charge transfer path and are arranged in a first charge transfer direction along which the charge transfer path transfers the electric charges. The branch electrode is provided above the charge branch path. The plurality of first branch transfer electrodes are provided above the first branch transfer path and are arranged in a second charge transfer direction along which the first branch transfer path transfers the electric charges. The plurality of second branch transfer electrodes are provided above the second branch transfer path and are arranged in a third charge transfer direction along which the second branch transfer path transfers the electric charges. The driving unit applies voltages to the transfer electrodes, the branch electrode, the first branch transfer electrodes and the second branch transfer electrodes, to drive the charge transfer path, the charge branch path, the first branch transfer path and the second branch transfer path. When the electric charges are transferred from the charge transfer path to the first branch transfer path, the driving unit applies predetermined voltages to the transfer electrodes and the first branch transfer electrodes while applying to the branch electrode a fixed voltage, which is independent from the voltages being applied to the transfer electrodes and the first branch transfer electrodes, so that step-like potentials being contiguous toward a downstream side in the first and second charge transfer directions are formed in a path from the charge transfer path, in which the charges are accumulated, to the first branch transfer path. The charge branch path includes a first portion being connected to the charge transfer path, a second portion being connected to the first branch transfer path and a third portion being connected to the second branch transfer path. The charge branch path includes a protrusion portion that protrudes inward from at least one of a first outer circumference that connects one of ends of the first portion in a direction perpendicular to the first charge transfer direction and one of ends of the second portion in a direction perpendicular to the second charge transfer direction, and a second outer circumference that connects the other end of the first portion in the direction perpendicular to the first charge transfer direction and one of ends of the third portion in a direction perpendicular to the third charge transfer direction.

Also, the protrusion portion may be formed of an element separation region that separates the charge transfer path, the charge branch path, the first branch transfer path and the second branch transfer path from other elements.

Also, the charge transfer path, the charge branch path, and the first branch transfer path and the second branch transfer path may be formed of impurity layers which are buried in a semiconductor substrate. The following relationship may be satisfied:

an impurity concentration of the impurity layer forming the charge transfer path <an impurity concentration of the impurity layer forming the charge branch path <an impurity concentration of the impurity layer forming the first and second branch transfer paths.

According to another aspect of the invention, an imaging apparatus includes photoelectric conversion elements, a vertical charge transfer device, and a horizontal charge transfer device. The vertical charge transfer device reads out electric charges being accumulated in the photoelectric conversion elements and transfers the electric charges in a vertical direction. The horizontal charge transfer device transfers the electric charges, which are transferred from the vertical charge transfer device, in a horizontal direction perpendicular to the vertical direction. Any of the charge transfer devices set forth above is used as the horizontal charge transfer device.

With the above configuration, it is possible to provide a charge transfer device that has a transfer path being branched into two lines and can reduce a charge transfer distance during distribution and transfer of electric charges in a charge branch path.

DETAILED DESCRIPTION OF EMBODIMENTS OF THE INVENTION

An embodiment of the invention will now be described with reference to the drawings.

Figure 1:
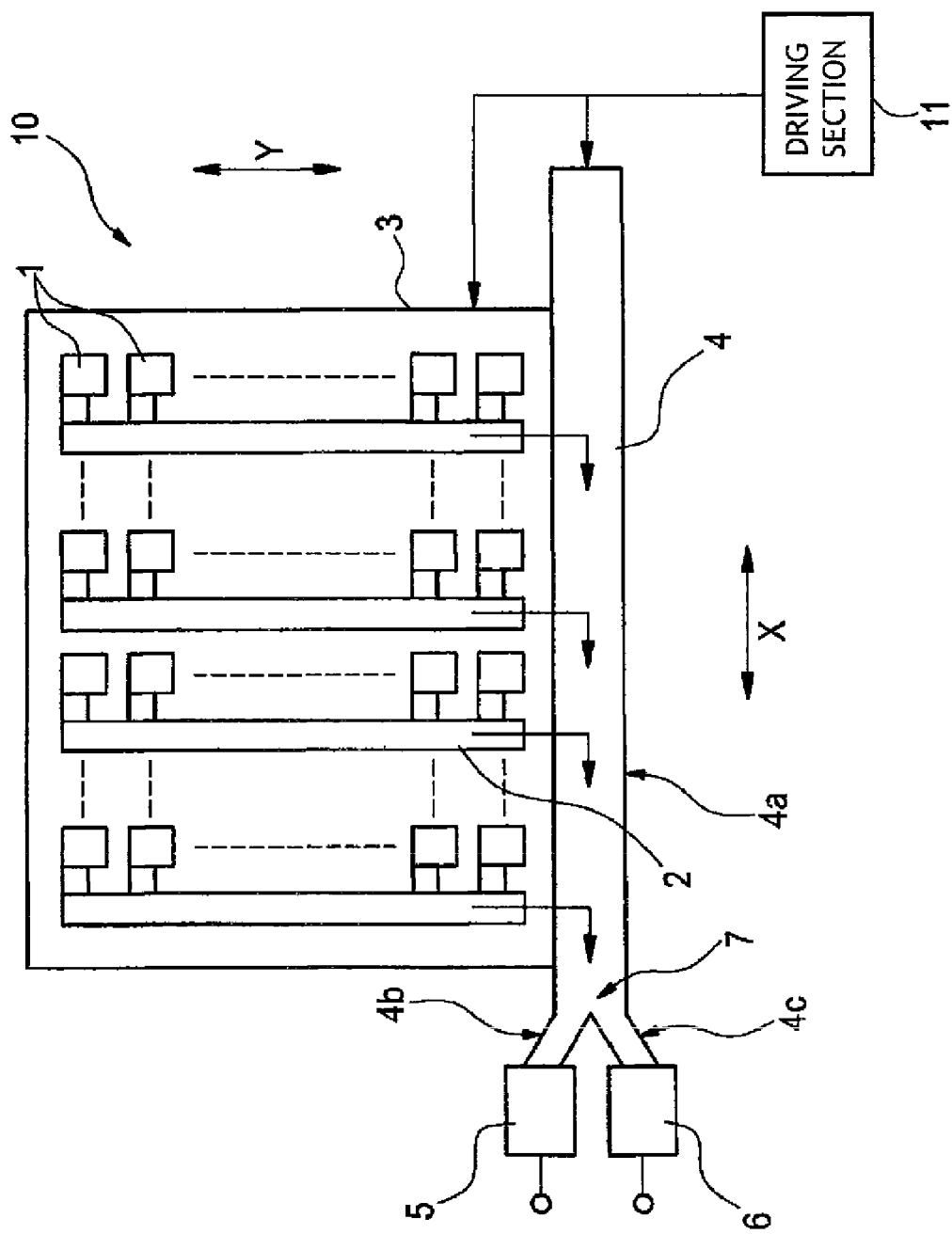
FIG. 1 is a diagram illustrating the schematic configuration of an imaging apparatus according to an embodiment of the invention.

FIG. 1 is a diagram illustrating the schematic configuration of an imaging apparatus according to an embodiment of the invention.

The imaging apparatus shown in FIG. 1 includes a solid-state imaging device 10 and a driving section 11 that drives the solid-state imaging device 10.

The solid-state imaging device 10 includes a large number of photoelectric conversion elements 1, vertical charge transfer devices (VCCDs) 2, and a horizontal charge transfer device (HCCD) 4. The photoelectric conversion elements 1 are arranged on a semiconductor substrate in a square lattice shape that is formed of a vertical direction (Y direction in the figure) and a horizontal direction (X direction in the figure) perpendicular to the vertical direction. Each VCCD 2 is provided on a side of a photoelectric conversion element array that is formed of the photoelectric conversion elements 1 being arranged in the Y direction. Each VCCD 2 reads out electric charges that are generated and accumulated in the photoelectric conversion elements 1 of the photoelectric conversion element array, and transfers the electric charges in the Y direction. The HCCD 4 transfers the electric charges, which are transferred through the VCCDs 2, in the X direction.

The HCCD 4 includes a charge transfer section 4a, a charge branch section 7, and two branch transfer sections 4b and 4c. The charge transfer section 4a transfers the electric charges in the X direction. The charge branch section 7 is connected to the charge transfer section 4a and alternately distributes the charges, which are transferred from the charge transfer section 4a, into two directions (different directions Z1 and Z2 that cross the X direction). The two branch transfer sections 4b and 4c are connected to the charge branch section 7 and are provided to correspond to the two directions. The branch transfer section 4b transfers the electric charges, which are transferred from the charge branch section 7, in the Z1 direction. An FD amplifier 5 is connected to an end of the branch transfer section 4b. The FD amplifier 5 converts the electric charges, which are transferred through the branch transfer section 4b, into signal voltages. The branch transfer section 4c transfers the electric charges, which are transferred from the charge branch section 7, in the Z2 direction. An FD amplifier 6 is connected to an end of the branch transfer section 4c. The FD amplifier 6 converts the electric charge, which are transferred through the branch transfer section 4c, into signal voltages.

Figure 2:
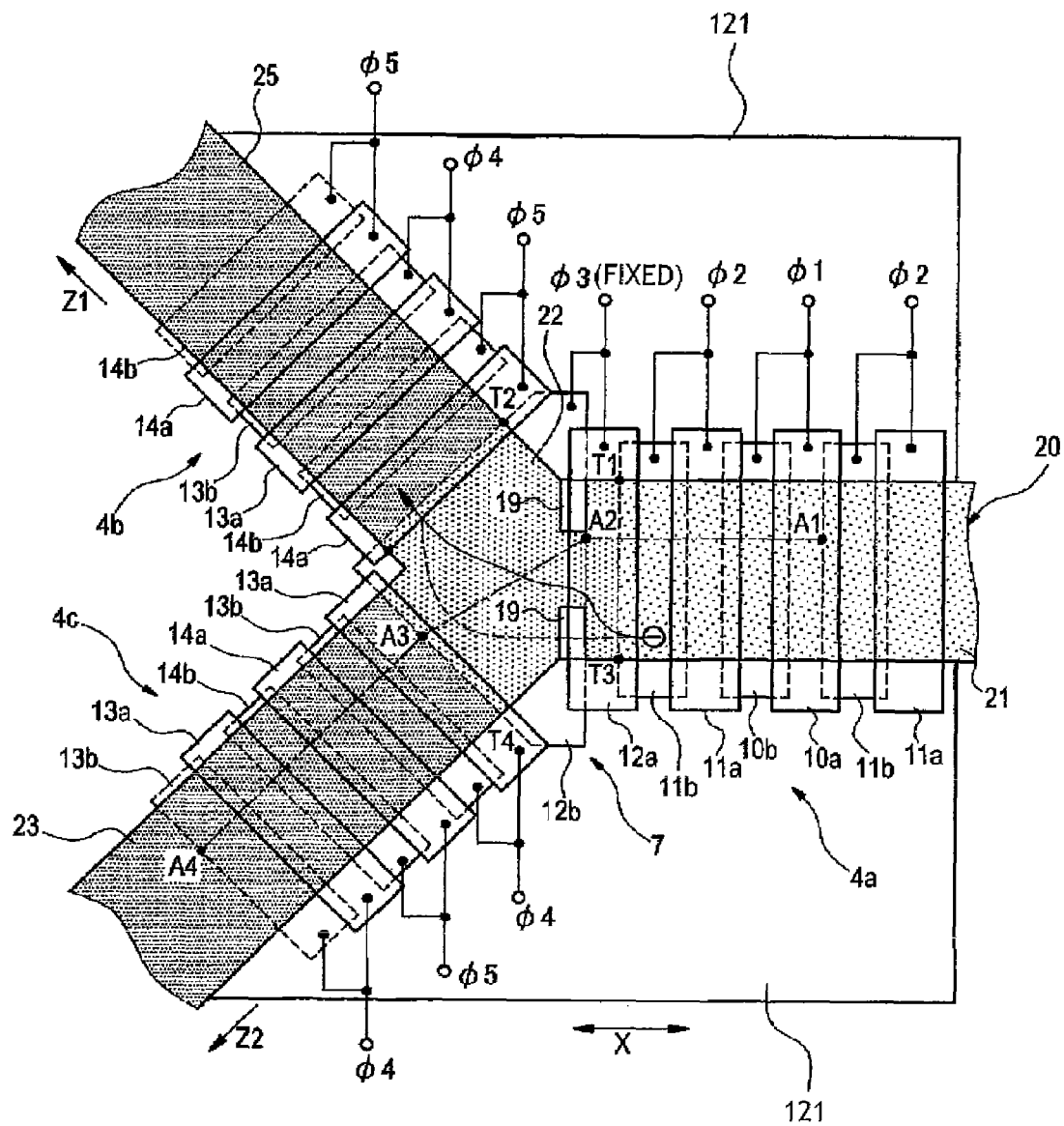
FIG. 2 is a partial enlarged view of an HCCD in a solid-state imaging device shown in FIG. 1.
Figure 3:
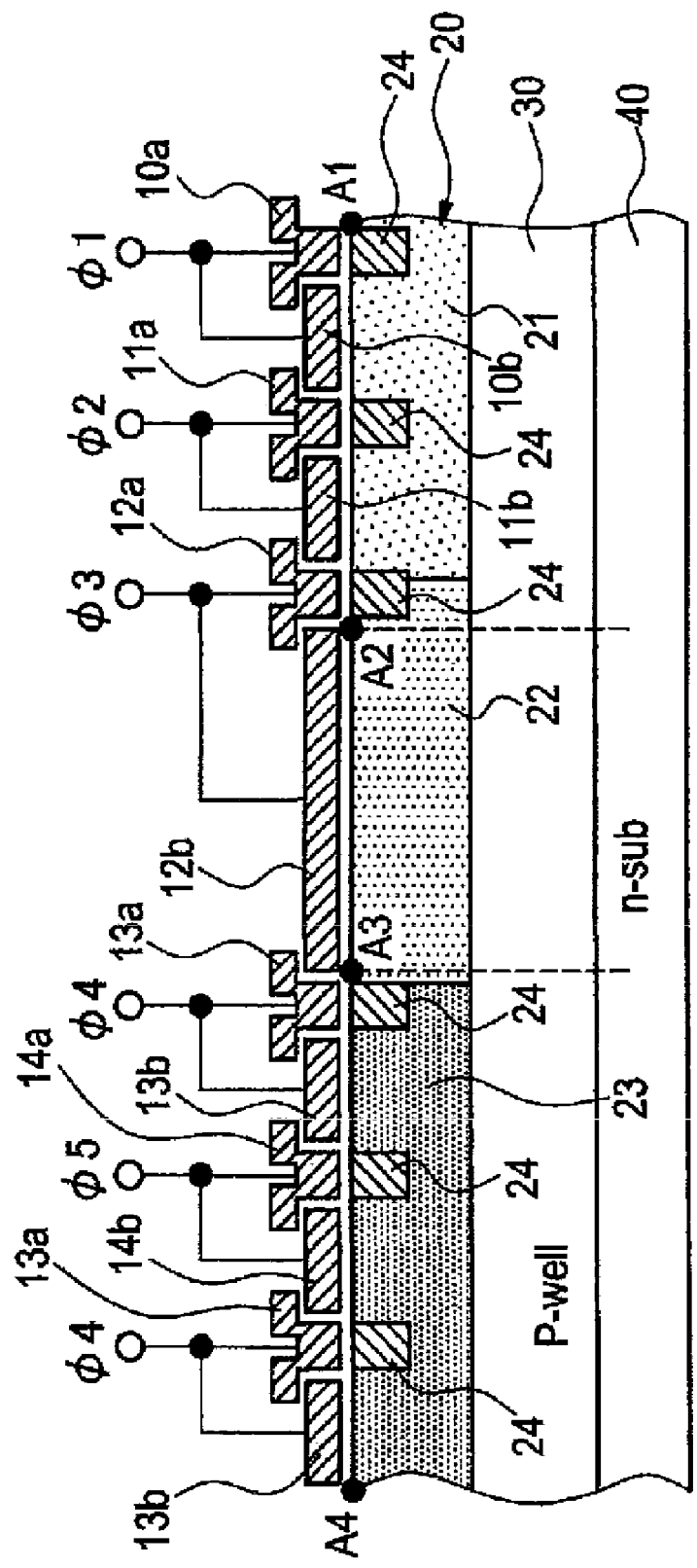
FIG. 3 is a schematic cross-sectional view taken along the line A1-A2-A3-A4 of FIG. 2.

FIG. 2 is a partial enlarged view of the HCCD 4 of the solid-state imaging device 10 shown in FIG. 1. FIG. 3 is a schematic cross-sectional view taken along the line A1-A2-A3-A4 of FIG. 2.

The HCCD 4 includes a charge transfer channel 20 that has an n-type silicon substrate 40 serving as a semiconductor substrate, a p-well layer 30 formed on the silicon substrate 40, and an n-type impurity layer formed inside of the surface of the p-well layer 30.

The charge transfer channel 20 has a linear channel 21 extending in the X direction, a linear channel 25 extending in the Z1 direction crossing the X direction, a linear channel 23 extending in the Z2 direction crossing the X direction, and a channel 22 connecting the channel 21 and the channels 23 and 25 with each other. The charge transfer channel 20 has an approximately Y shape. An element separation region 121 that separates the charge transfer channel 20 from other elements in the semiconductor substrate is formed around the charge transfer channel 20.

The relationships among the impurity concentrations of the channels are as follows: the channel 23 and the channel 25 have the same impurity concentration; and the impurity concentration of the channel 21<the impurity concentration of the channel 22<the impurity concentration of the channel 23 and 25.

The charge transfer section 4a includes the channel 21 and transfer electrodes 10a, 10b, 11a, and 11b formed above the channel 21 with a gate insulating film (not shown) interposed therebetween. The transfer electrodes 10a, 10b, 11a, and 11b are arranged as follows: the transfer electrode 11b is arranged above a downstream end of the channel 21 in a charge transfer direction; the transfer electrode 11a is arranged on an upper stream side of the transfer electrode 11b in the charge transfer direction; the transfer electrode 10b is arranged on an upper stream side of the transfer electrode 11a in the charge transfer direction; and the transfer electrode 10a is arranged on an upper stream side of the transfer electrode 10b in the charge transfer direction. That is, a pattern in which the transfer electrodes 11b, 11a, 10b, and 10a are arranged in the X direction (toward the upstream side in the charge transfer direction along which the charge transfer section 4a transfers the charge electrodes) in this order is repetitively arranged in the X direction.

The transfer electrode 10b and the transfer electrode 11b are charge accumulating electrodes for forming packets to accumulate charges in the channel 21 therebelow. The transfer electrode 10a and the transfer electrode 11a are barrier electrodes for forming barriers for the packets.

A voltage φ1 is applied to the transfer electrode 10a and the transfer electrode 10b from the driving section 11. A voltage φ2 is applied to the transfer electrode 11a and the transfer electrode 11b from the driving section 11. Each of the voltages φ1 and φ2 become one of a high level and a low level. P-type impurity layers (hereinafter referred to as 'p-layer') 24 are formed in the channel 21 below the transfer electrode 10a and the transfer electrode 11a. As such, the charge transfer section 4a has a buried channel type two-phase driving shift register structure.

The charge branch section 7 includes the channel 22 and branch electrodes 12a and 12b formed above the channel 22 with a gate insulating film (not shown) interposed therebetween. The channel 22 is connected to a downstream end of the channel 21 in the charge transfer direction. The branch electrode 12a is located y near the transfer electrode 11b above the downstream end of the channel 21 in the charge transfer direction. The branch electrode 12b has a home plate shape formed by cutting off the angular portions located at both ends of the base of an isosceles triangle along lines perpendicular to the base. The branch electrode 12b is located on the downstream side of the branch electrode 12a in the charge transfer direction along which the charge transfer section 4a transfers electric charges, and is adjacent to the branch electrode 12a. The branch electrode 12b is arranged so that the apex thereof directs toward the downstream side in the charge transfer direction along which the charge transfer section 4a transfers electric charges.

A voltage φ3 is applied to the branch electrode 12a and the branch electrode 12b from the driving section 11. The voltage φ3 is a fixed DC current that is not changed depending on the voltages φ1 and φ2. A p-layer 24 is formed in the channel 22 below the branch electrode 12a.

The branch transfer section 4b includes the channel 25 and branch transfer electrodes 13a, 13b, 14a, and 14b, which are formed above the channel 25, with a gate insulating film (not shown) being interposed therebetween. The branch transfer electrodes 13a, 13b, 14a, and 14b are arranged as follows: the branch transfer electrode 14a is arranged to be adjacent to a side of the branch electrode 12b perpendicular to the Z1 direction (a charge transfer direction along which the branch transfer section 4b transfers the electric charges); the branch transfer electrode 14b is arranged to be adjacent to the branch transfer electrode 14a in the Z1 direction; the branch transfer electrode 13a is arranged to be adjacent to the branch transfer electrode 14b in the Z1 direction; and the branch transfer electrode 13b is arranged to be adjacent to the branch transfer electrode 13a in the Z1 direction. That is, a pattern in which the branch transfer electrodes 14a, 14b, 13a, and 13b are arranged in this order is repeatedly arranged in the Z1 direction. The branch transfer electrode 13b and the branch transfer electrode 14b are charge accumulating electrodes for forming packets to accumulate electric charges in the channel 25 therebelow. The branch transfer electrode 13a and the branch transfer electrode 14a are barrier electrodes for forming barriers against the packets.

A voltage φ4 is applied to the branch transfer electrode 13a and the branch transfer electrode 13b from the driving section 11. A voltage φ5 is applied to the branch transfer electrode 14a and the branch transfer electrode 14b from the driving section 11. Each of the voltages φ4 and φ5 becomes a high level and a low level. P-layers 24 are formed in the channel 25 below the branch transfer electrode 13a and the branch transfer electrode 14a. As such, the branch transfer section 4b has a buried channel type two-phase driving shift register structure.

The branch transfer section 4c includes the channel 23 and branch transfer electrodes 13a, 13b, 14a, and 14b, which are formed above the channel 23, with a gate insulating film (not shown) being interposed therebetween. The branch transfer electrodes 13a, 13b, 14a, and 14b are arranged as follows: the branch transfer electrode 13a is arranged to be adjacent to a side of the branch electrode 12b perpendicular to the Z2 direction (a charge transfer direction along which the branch transfer section 4c transfers the electric charges); the branch transfer electrode 13b is arranged to be adjacent to the branch transfer electrode 13a in the Z2 direction; the branch transfer electrode 14a is arranged to be adjacent to the branch transfer electrode 13b in the Z2 direction; and the branch transfer electrode 14b is arranged to be adjacent to the branch transfer electrode 14a in the Z2 direction. That is, a pattern in which the branch transfer electrodes 13a, 13b, 14a, and 14b are arranged in this order is repeatedly arranged in the Z2 direction. The branch transfer electrode 13b and the branch transfer electrode 14b are charge accumulating electrodes for forming packets to accumulate electric charges in the channel 23 therebelow. The branch transfer electrode 13a and the branch transfer electrode 14a are barrier electrodes for forming barriers against the packets.

The voltage φ4 is applied to the branch transfer electrode 13a and the branch transfer electrode 13b from the driving section 11. The voltage φ5 is applied to the branch transfer electrode 14a and the branch transfer electrode 14b from the driving section 11. P-layers 24 are formed in the channel 23 below the branch transfer electrode 13a and the branch transfer electrode 14a. As such, the branch transfer section 4c has a buried channel type two-phase driving shift register structure.

Hereinafter, the transfer electrode 11b being adjacent to the branch electrode 12a is referred to as a last transfer electrode 11b, and the branch transfer electrode 14a being adjacent to the branch electrode 12b is referred to as a last branch transfer electrode 14a. Also, the branch transfer electrode 13a being adjacent to the branch electrode 12b is referred to as a last branch transfer electrode 13a.

The channel 22 of the charge branch section 7 has protrusion portions 19 that protrude inward (i) from a first outer circumference which connects one end (T1 in FIG. 2) of a portion, being connected to the channel 21, in the Y direction and one end (T2 in FIG. 2) of a portion, being connected to the channel 25, in a direction perpendicular to the Z1 direction, and (ii) from a second outer circumference which connects the other end (T3 in FIG. 2) of the portion, being connected to the channel 21, in the Y direction and one end (T4 in FIG. 2) of a portion, being connected to the channel 23, in a direction perpendicular to the Z2 direction.

The protrusion portions 19 are provided to make the travel path of the electric charge being accumulated in the channel 21 below the last transfer electrode 11b from the channel 21 to the last branch transfer electrode 14a or the last branch transfer electrode 13a as linear as possible. The protrusion portions 19 has a function to adjust the travel path of the electric charges such that all the electric charges being accumulated in the channel 21 below the last transfer electrode 11b are moved in the vicinity of the widthwise center of the channel 22 in the Y direction and then to a packet of a transfer destination. Moreover, the shape of each of the protrusion portions 19 is not limited to that shown in FIG. 2 insofar as it has such a function. The protrusion portions 19 are formed by causing the element separation region 121 to eat away a part of the channel 22.

It is assumed that the electric charges being accumulated in the channel 21 below the last transfer electrode 11b are moved from the channel 21 to the channel below the last branch transfer electrode 14a. In this case, if the protrusion portions 19 are not provided, the electric charges being accumulated in the end of the channel 21 in the Y direction among the electric charges being accumulated in the channel 21 below the last transfer electrode 11b travel linearly for a while due to a fringing electric field generated by the last transfer electrode 11a and the branch electrodes 12a and 12b, as indicated by a broken-line arrow in FIG. 2. Thereafter, the traveling direction of the electric charges is gradually changed toward the channel 25, and the electric charges are moved toward the channel 25. That is, the travel path of the electric charges becomes curved.

In contrast, if the protrusion portions 19 are provided, since the width of the channel 22 in the Y direction becomes narrow due to the protrusion portions 19, the electric charges in the end of the channel 21 in the Y direction among the electric charges being accumulated in the channel 21 below the last transfer electrode 11b travel while passing in the vicinity of the widthwise center of the channel 22 in the Y direction, as compared with the case where the protrusion portions 19 are not provided. For this reason, as indicated by a solid-line arrow in FIG. 2, the travel path of the electric charges becomes more similar to a linear shape and the length of the travel path is more reduced than the case where the protrusion portions 19 are not provided.

Figure 4:
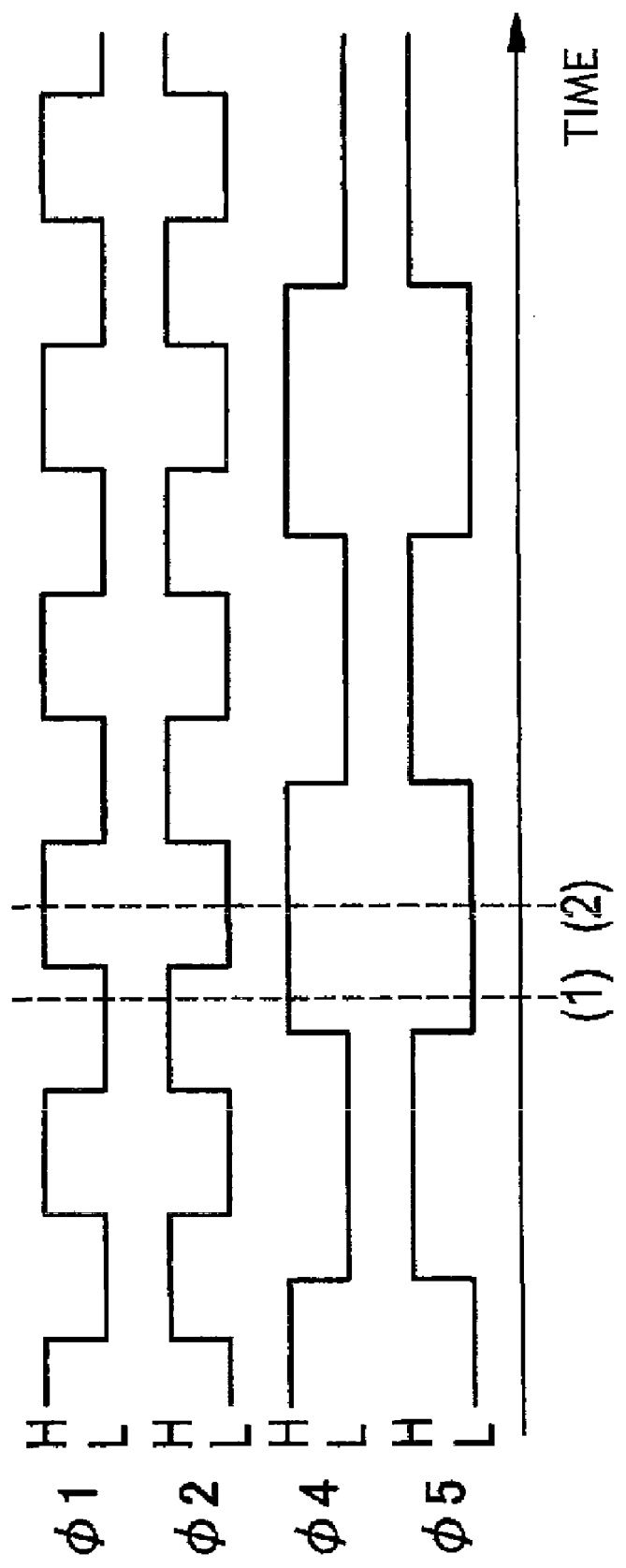
FIG. 4 is a diagram illustrating an example of a driving timing chart of an HCCD in the solid-state imaging device shown in FIG. 1.

The driving section 11 drives the HCCD 4 by supplying the voltages φ1, φ2, φ3, φ4, and φ5 to the HCCD 4. FIG. 4 is a diagram illustrating an example of a timing chart of the voltages φ1, φ2, φ4, and φ5 which are supplied from the driving section 11. As should in FIG. 4, by driving the transfer electrodes 13a, 13b, 14a, and 14b at a frequency, which is equal to a half of a driving frequency of the transfer electrodes 10a, 10b, 11a, and 11b, the electric charges being transferred from the charge transfer section 4a can be alternatively distributed into the branch transfer section 4b and the branch transfer section 4c and then transferred. Moreover, the voltages φ1, φ2, φ4, and φ5 have the same voltage amplitude at the high level and have the same voltage amplitude at the low level. Also, the amplitude of the voltage φ3 is set, for example, to be equal to the amplitude of the voltage φ1 at the high level.

Next, the operation when the electric charges are transferred from the charge transfer section 4a to the branch transfer section 4c will be described.

Figure 5:
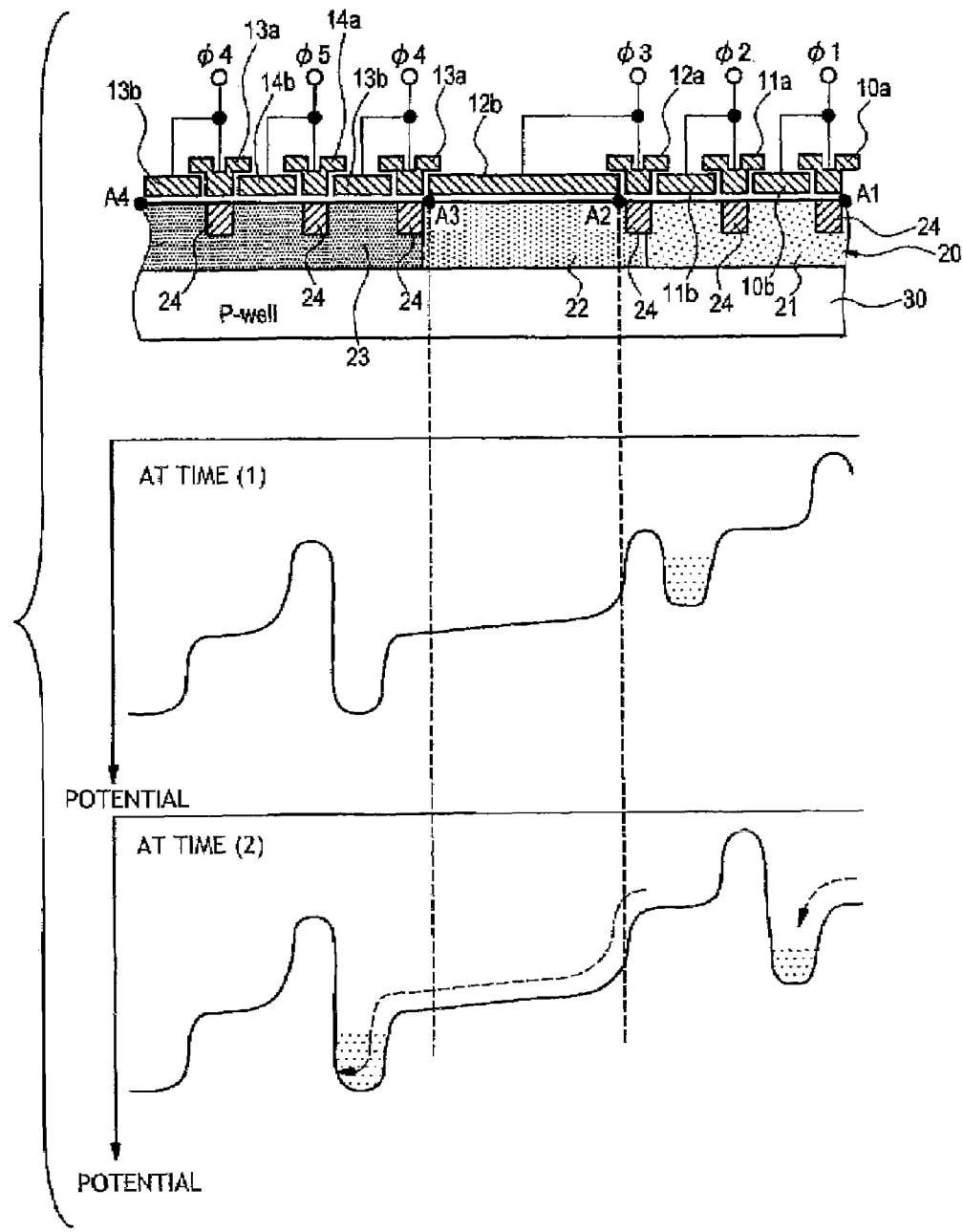
FIG. 5 is a diagram illustrating potentials corresponding to the schematic cross-sectional view of FIG. 3 at time (1) and time (2) shown in FIG. 4.
Figure 6:
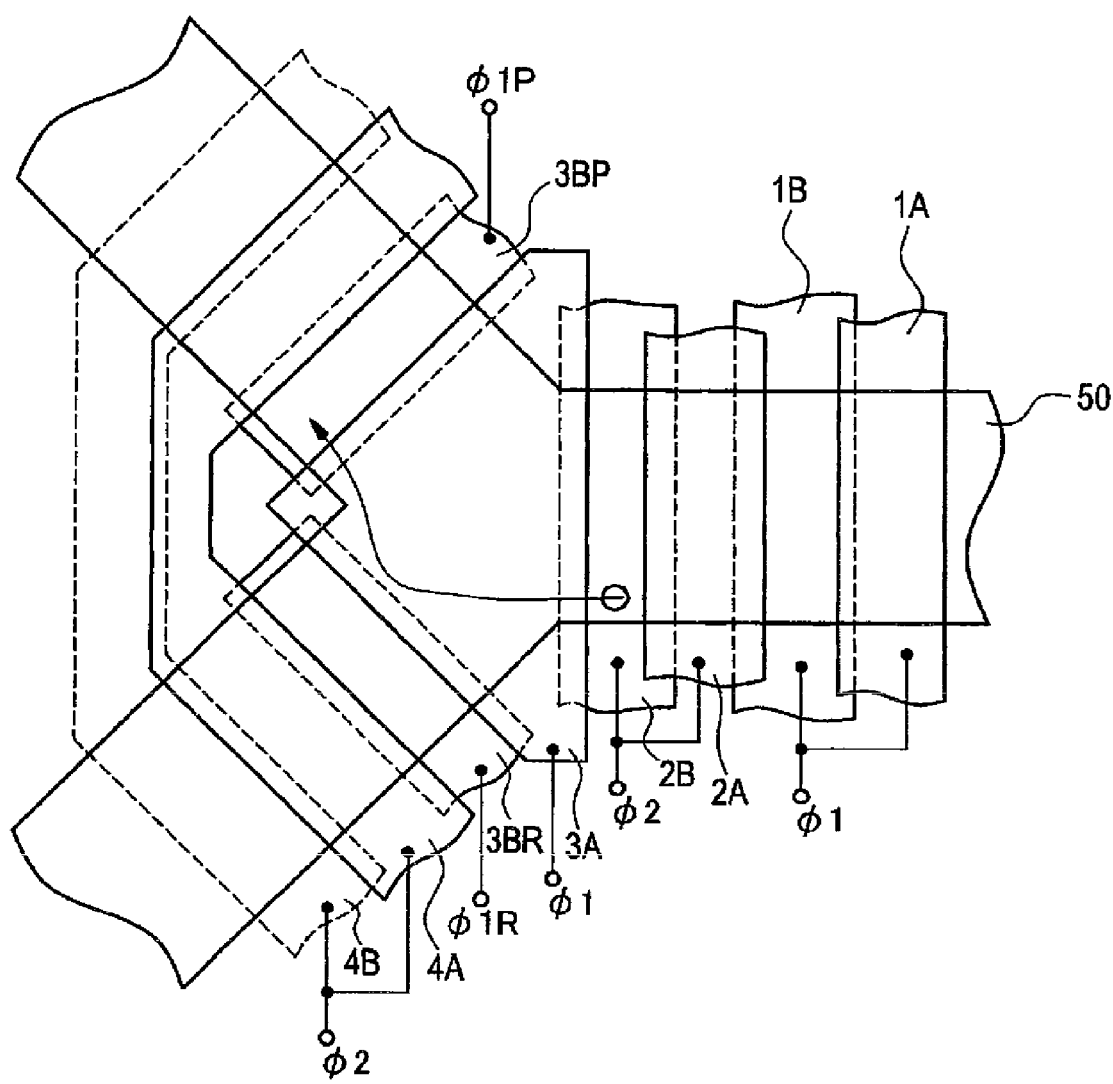
FIG. 6 is a diagram illustrating the schematic configuration of a horizontal charge transfer device of the related art.

FIG. 5 is a diagram illustrating potentials corresponding to the schematic cross-sectional view of FIG. 3 at time (1) and at time (2) shown in FIG. 4.

At the time (1), the voltage φ1 becomes the low level and the voltage φ2 becomes the high level. Accordingly, the electric charges being accumulated in the packets formed below the transfer electrode 10b are moved to and accumulated in the packets formed below the transfer electrode 11b.

Also, at the time (1), the voltage φ4 becomes the high level and the voltage φ5 becomes the low level. Then, the potential below the last branch transfer electrode 13a becomes higher than the potential below the branch electrode 12b, and the potential below the last branch transfer electrode 14a becomes lower than the potential below the branch electrode 12b.

Next, at the time (2), the voltage φ1 becomes the high level and the voltage φ2 becomes the low level. Then, the potential below the last transfer electrode 11b becomes lower than the potential below the branch electrode 12a. Accordingly, the electric charges below the last transfer electrode 11b are moved to the packets below the branch transfer electrode 13b being adjacent to the last branch transfer electrode 13a.

In the HCCD 4, the following relation is satisfied:
the impurity concentration of the channel 21
<the impurity concentration of the channel 22
<the impurity concentration of the channel 23

Also, the voltage φ3 is fixed. For this reason, at the time (2), as shown in FIG. 5, in a path from the packets in the channel 21 in which the electric charges are accumulated to the packets in the channel 23 which is the transfer destination of the electric charges, a step-like potential being contiguous toward the downstream side in the charge transfer direction is formed.

By forming such potentials, the electric charges, which are transferred from the channel 21 below the transfer electrode 11b being on the upstream side and being adjacent to the branch electrode 12a, pass the channel 22 below the branch electrodes 12a and 12b as they are, and are then moved to the channel 23 below the branch transfer electrode 13b on the downstream side. Since the potentials of the branch electrodes 12a and 12b are fixed to the predetermined DC potential, the regulation of the charge transfer time by a two-phase clock at the higher frequency in the charge transfer section 4a is released. Accordingly, the charge transfer time in the charge branch section 7 can be set to the charge transfer time in the branch transfer sections 4b and 4c, which is twice as long as the charge transfer time in the charge transfer section 4a.

As described above, according to the imaging apparatus of this embodiment, when the electric charges are transferred from the charge transfer section 4a to the branch transfer section 4b or 4c, the travel path of the electric charges can be shortened as compared with the related art. As a result, it becomes not necessary to increase the charge transfer time so much, and the charge transfer efficiency can be prevented from being deteriorated.

In the foregoing description, the protrusion portions 19 are provided to protrude inward from the first outer circumference, which connects the end T1 and the end T2, and from the second outer circumference, which connects the end T3 and the end T4. Alternatively, the protrusion portion 19 may be provided in one of the first outer circumference and the second outer circumference. In this case, electric charges in one end of a packet among the electric charges in the packet below the last transfer electrode 11b travel along the same travel path as that in the related art, but the travel path of the electric charges in the other end can be shortened. Accordingly, it is possible to reduce the charge travel distance.

In the foregoing description, the channel 21, the channel 22, and the channels 23 and 25 are different in impurity concentration. Accordingly, as shown in FIG. 5, in a path from the packet in the channel 21 in which the electric charges are accumulated to the packet in the channel 23 serving as the transfer destination of the electric charges, the step-like potentials being contiguous toward the downstream side in the charge transfer direction are formed. Alternatively, the channel 21, the channel 22, and the channels 23 and 25 may be not different in impurity concentration. In this case, by adjusting the amplitudes of the voltages φ1 to φ5, the step-like potentials may be formed.

What is claimed is:

1. A charge transfer device comprising:
    a charge transfer path that transfers electric charges;
    a charge branch path that is connected to the charge transfer path and distributes the electric charges, which are transferred along the charge transfer path, into two directions;
    first and second branch transfer paths that are connected to the charge branch path and are provided corresponding to the two directions;
    a plurality of transfer electrodes that are provided above the charge transfer path and are arranged in a first charge transfer direction along which the charge transfer path transfers the electric charges;
    a branch electrode that is provided above the charge branch path;
    a plurality of first branch transfer electrodes that are provided above the first branch transfer path and are arranged in a second charge transfer direction along which the first branch transfer path transfers the electric charges;
    a plurality of second branch transfer electrodes that are provided above the second branch transfer path and are arranged in a third charge transfer direction along which the second branch transfer path transfers the electric charges; and
    a driving unit that applies voltages to the transfer electrodes, the branch electrode, the first branch transfer electrodes and the second branch transfer electrodes, to drive the charge transfer path, the charge branch path, the first branch transfer path and the second branch transfer path, wherein
    when the electric charges are transferred from the charge transfer path to the first branch transfer path, the driving unit applies predetermined voltages to the transfer electrodes and the first branch transfer electrodes while applying to the branch electrode a fixed voltage, which is independent from the voltages being applied to the transfer electrodes and the first branch transfer electrodes, so that step-like potentials being contiguous toward a downstream side in the first and second charge transfer directions are formed in a path from the charge transfer path, in which the charges are accumulated, to the first branch transfer path,
    the charge branch path includes a first portion being connected to the charge transfer path, a second portion being connected to the first branch transfer path and a third portion being connected to the second branch transfer path, and
    the charge branch path includes a protrusion portion that protrudes inward from at least one of
        a first outer circumference that connects one of ends of the first portion in a direction perpendicular to the first charge transfer direction and one of ends of the second portion in a direction perpendicular to the second charge transfer direction, and
        a second outer circumference that connects the other end of the first portion in the direction perpendicular to the first charge transfer direction and one of ends of the third portion in a direction perpendicular to the third charge transfer direction.

2. The charge transfer device according to claim 1, wherein the protrusion portion is formed of an element separation region that separates the charge transfer path, the charge branch path, the first branch transfer path and the second branch transfer path from other elements.

3. The charge transfer device according to claim 1, wherein
    the charge transfer path, the charge branch path, and the first branch transfer path and the second branch transfer path are formed of impurity layers which are buried in a semiconductor substrate, and
    the following relationship is satisfied:
    an impurity concentration of the impurity layer forming the charge transfer path
    <an impurity concentration of the impurity layer forming the charge branch path
    <an impurity concentration of the impurity layer forming the first and second branch transfer paths.

4. The charge transfer device according to claim 2, wherein
    the charge transfer path, the charge branch path, and the first branch transfer path and the second branch transfer path are formed of impurity layers which are buried in a semiconductor substrate, and
    the following relationship is satisfied:
    an impurity concentration of the impurity layer forming the charge transfer path
    <an impurity concentration of the impurity layer forming the charge branch path
    <an impurity concentration of the impurity layer forming the first and second branch transfer paths.

5. An imaging apparatus comprising:
    photoelectric conversion elements;
    a vertical charge transfer device that reads out electric charges being accumulated in the photoelectric conversion elements and transfers the electric charges in a vertical direction; and
    a horizontal charge transfer device that transfers the electric charges, which are transferred from the vertical charge transfer device, in a horizontal direction perpendicular to the vertical direction, wherein
    the charge transfer device according to claim 1 is used as the horizontal charge transfer device.

6. An imaging apparatus comprising:

photoelectric conversion elements;

a vertical charge transfer device that reads out electric charges being accumulated in the photoelectric conversion elements and transfers the electric charges in a vertical direction; and a horizontal charge transfer device that transfers the electric charges, which are transferred from the vertical charge transfer device, in a horizontal direction perpendicular to the vertical direction, wherein the charge transfer device according to claim 2 is used as the horizontal charge transfer device.

7. An imaging apparatus comprising:

photoelectric conversion elements;

a vertical charge transfer device that reads out electric charges being accumulated in the photoelectric conversion elements and transfers the electric charges in a vertical direction; and a horizontal charge transfer device that transfers the electric charges, which are transferred from the vertical charge transfer device, in a horizontal direction perpendicular to the vertical direction, wherein the charge transfer device according to claim 3 is used as the horizontal charge transfer device.

8. An imaging apparatus comprising:

photoelectric conversion elements;

a vertical charge transfer device that reads out electric charges being accumulated in the photoelectric conversion elements and transfers the electric charges in a vertical direction; and a horizontal charge transfer device that transfers the electric charges, which are transferred from the vertical charge transfer device, in a horizontal direction perpendicular to the vertical direction, wherein the charge transfer device according to claim 4 is used as the horizontal charge transfer device.

* * * * *

UNITED STATES PATENT AND TRADEMARK OFFICE
CERTIFICATE OF CORRECTION

PATENT NO. : 7,605,411 B2 Page 1 of 1
APPLICATION NO. : 12/175337
DATED : October 20, 2009
INVENTOR(S) : Hirokazu Shiraki et al.

It is certified that error appears in the above-identified patent and that said Letters Patent is hereby corrected as shown below:

On the title page add, item (30)  Foreign Application Priority Data

July 18, 2007      (JP)................P2007-186740

Signed and Sealed this

Twenty-third Day of February, 2010

David J. Kappos
*Director of the United States Patent and Trademark Office*